United States Patent [19]

Zorabedian

[11] Patent Number: 5,161,165
[45] Date of Patent: Nov. 3, 1992

[54] MULTIMODE STABILIZED EXTERNAL CAVITY LASER

[75] Inventor: Paul Zorabedian, Mountain View, Calif.

[73] Assignee: Hewlett-Packard Company, Palo Alto, Calif.

[21] Appl. No.: 766,595

[22] Filed: Sep. 26, 1991

[51] Int. Cl.$^5$ .............................................. H01S 3/13
[52] U.S. Cl. ...................................... 372/20; 372/31; 372/102; 372/92; 372/38
[58] Field of Search .................. 372/18, 20, 31, 32, 372/92, 98, 102, 38

[56] References Cited

U.S. PATENT DOCUMENTS

| | | | |
|---|---|---|---|
| 4,103,254 | 7/1978 | Chikami | 372/32 |
| 4,504,950 | 3/1985 | AuYeung | 372/20 |
| 4,622,672 | 11/1986 | Coldren et al. | 372/32 |
| 4,942,583 | 7/1990 | Nazarathy et al. | 372/20 |
| 4,995,050 | 2/1991 | Waarts et al. | 372/95 |
| 5,077,747 | 12/1991 | Hemmer et al. | 372/20 |

OTHER PUBLICATIONS

N. A. Olsson et al., "Performance Characteristics of 1.5--m External cavity Semiconductor Laser for Coherent Optical Communication", Apr. '87, Journal of Lightwave Technology, pp. 510-515.
Richard E. Wagner et al., "Heterodyne Lightwave System: Moving towards Commercial Use", Nov. '90, IEEE LCS, pp. 28-35.
Paul S. Henry, "Lightwave Primer", Dec. '85, IEEE Journal of Quantum Electronics, vol. QE-21, No. 12, pp. 1862-1878.
Richard A. Linke et al., "Coherent optical detection: a thousand calls on one circuit", Feb. '87, IEEE Spectrum, pp. 52-57.
A. Olsson et al., "Electrooptically Tuned External-Cavity CW Semiconductor Laser and FM Optical Communications", Oct. '79, IEEE Journal of Quantum Electronics, vol. QE-15, No. 10, pp. 1085-1088.
M. Ohtsu, et al., "A simple Interferometric Method For Monitoring Mode Hopping in Tunable External-Cavity Semiconductor Lasers", Jan. '89, Journal of Lightwave Technology, vol. 7, No. 1, pp. 68-76.

Primary Examiner—Léon Scott, Jr
Attorney, Agent, or Firm—Howard R. Boyle

[57] ABSTRACT

An etalon stabilized external cavity laser. The present invention is embodied in an external cavity laser and utilizes a servo circuit to adjust the angle of an intracavity etalon to suppress multimode operation of the laser. The servo circuit employs a diode detector to detect a beat frequency that occurs during multimode laser operation. The output from the diode is amplified, compared and integrated to produce a control signal. This signal is used to control the angle of the etalon and thereby suppress the multimode operation of the laser.

8 Claims, 4 Drawing Sheets

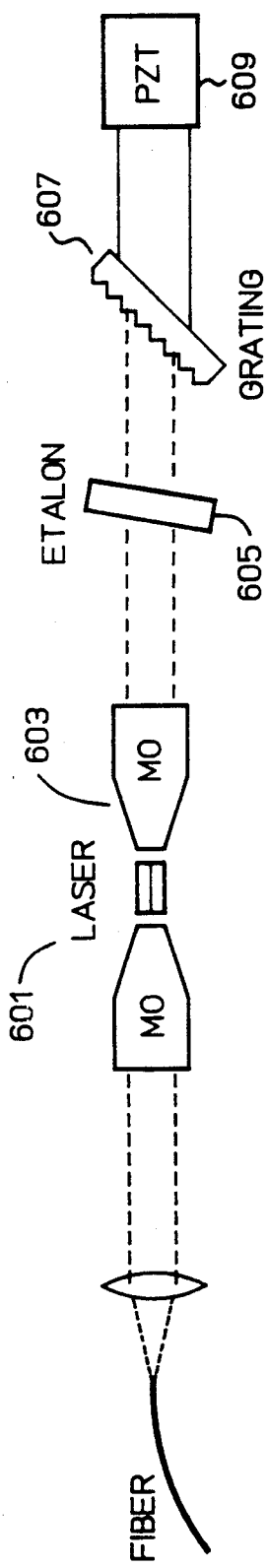
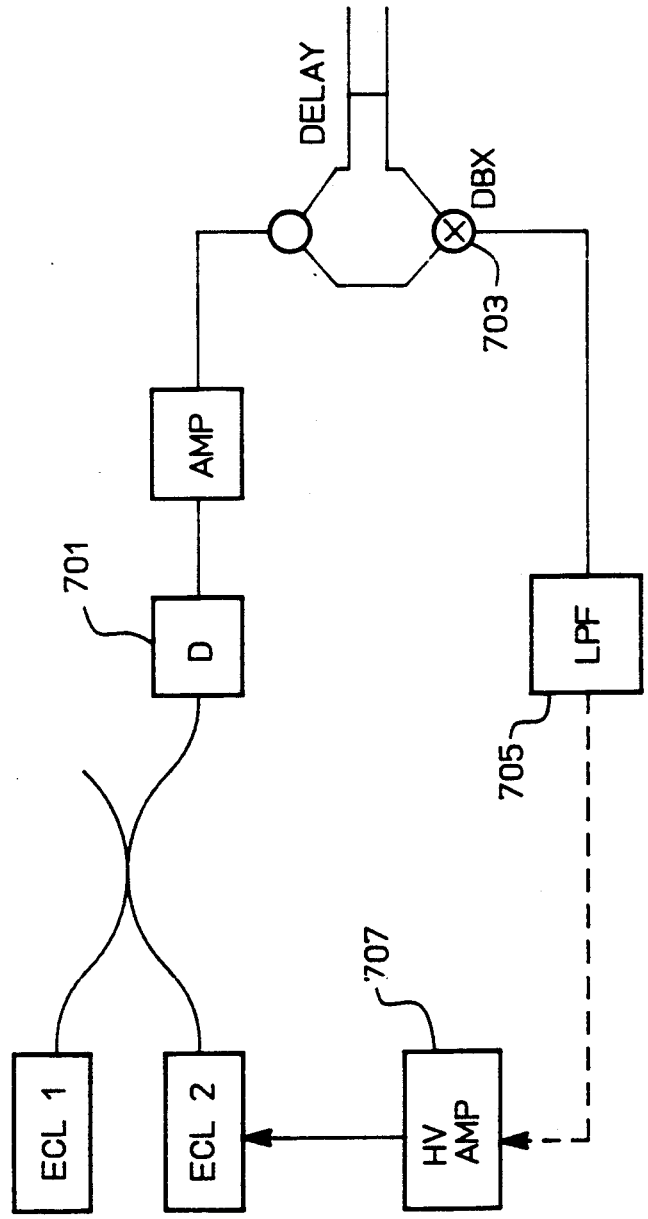
FIG 6 (PRIOR ART)
FIG 7 (PRIOR ART)

MULTIMODE STABILIZED EXTERNAL CAVITY LASER

BACKGROUND OF THE INVENTION

1. Field of the Invention

This invention relates generally to lasers and more particularly to etalon stabilized, grating tuned, external cavity semiconductor lasers.

2. Description of the Prior Art

Future optical communications systems employing heterodyne methods will require turnable, single-frequency, narrow-linewidth, semiconductor lasers. Such laser systems will be modulated and coupled to optical fiber cables for transmission of the light energy to a distant receiver. This type of laser optical system has distinct bandwidth advantages over the systems currently in use which makes it attractive for high-bit-rate and long-haul optical communications systems.

For heterodyne communications and other coherent (single frequency) applications, such as heterodyne signal analysis, the line-width (optical bandwidth) of monolithic single frequency lasers may not be sufficiently narrow for acceptable system performance. External cavity, grating tuned, semiconductor lasers, however, have the narrow linewidth and tuning range needed for such applications.

The narrow linewidth of the external cavity laser is particularly important in optical heterodyne spectrum analysis equipment. In these systems, the linewidth of the local oscillator used in such equipment should be much narrower than that of the signal under test. In addition, the longitudinal sidemode suppression ratio of the local oscillator must be very high, in excess of 30db, since any sidemodes on the local oscillator would be indistinguishable from spectral features on the signal under test.

The design of grating tuned external cavity semiconductor lasers is well known in the art. An example of an external cavity laser design is disclosed in U.S. Pat. No. 4,942,583 issued to Paul Zorabedian et al. and assigned to Hewlett-Packard Company.

One drawback of external cavity lasers is their tendency to hop (switch) between two or more longitudinal mode frequencies (multimode) during tuning or when the bias current is increased to maximize the laser output power. The multimode operation occurs because the bandwidth of the external cavity laser is not sufficiently narrow to exclude all but one frequency of operation.

There are three general types of multimode operations. Although not always the case, the three types of multimode operations tend to occur at successively higher ranges of drive current as shown in FIG. 1.

The type I multimode operation tends to occur nearest the threshold of the semiconductor laser. However, it can extend to the semiconductor's upper current limit. As shown in FIG. 2, the type I multimode condition is characterized by a strong main mode and two weak symmetric sidemodes. The sidemode ratio may be anywhere from approximately $-10$ to $-30$ db. This is the mildest form of laser multimode operation with the linewidth of the main mode comparable to that of a single oscillating mode (approximately 50-100 kilohertz "KHz").

The type II multimode operation, as shown in FIG. 3, tends to occur at higher current levels than type I but it sometimes occurs right at the threshold current of the semiconductor. There may be several modes with approximately equal energy levels and there may be no discernable main mode. The linewidths of the individual modes may be somewhat broadened compared to type I and of approximately 100 KHz to 10 MHz. With the type II multimode condition, the laser energy may be spread over several frequencies and the laser system will no longer function in coherent applications.

The type III multimode operation occurs at the highest current range of the semiconductor. The energy is spread more or less uniformly over many frequencies, as shown in FIG. 4, each of which is broadened to a GHz or more. The type III multimode operation is the regime of "coherence collapse". This collapse is generally due to the onset of optical chaos in the external cavity where no single main mode is amplified.

Attempts have been made to control external cavity lasers to prevent multimode operation. M. Ohtsu et al describe one such attempt in the "Journal of Lightwave Technology", Vol. 7, No. 1, Jan. 1989, in the article titled "A Simple Interferometric Method for Monitoring Mode Hopping in Tunable External-Cavity Semiconductor Lasers". Their experimental apparatus is shown in FIG. 5.

In the Ohtsu et al experiment, an automatic control was built using a electro-optical servo loop to suppress multimoding. A fiber delay line 501 was used to increase the temporal overlap of the laser modes thereby increasing the resultant optical signal. A local oscillator 503 and mixer 505 were used to down convert the beat signal from the detector 507, typically a few GHZ, to a few hundred MHZ. The down conversion process produces a radio frequency (RF) signal that is used to control a piezo electric transducer (PZT) 509.

Ohtsu et al. uses the presence of the mode beat signal to change the cavity length. This is accomplished by varying the voltage to the PZT and thereby moving the grating 511. The movement of the grating does not change the pass bandwidth of the optical feedback, only the feedback phase. If the change in the grating position causes the laser output to become single mode, the beat signal disappears and the present voltage to the PZT is maintained thereby maintaining the feedback phase at the proper value.

The inventor's experimental results have shown that adjusting the length of the cavity does not suppress all three types of multimode operation. Although changing the length of the cavity suppresses type I multimode operation, it is only partially effective in suppressing type II multimode operation and it is ineffective in suppressing type III multimode operation. Additionally, the cavity length sometimes requires readjustment if the laser current is changed even within one particular regime of multimode operation for which it is effective.

In the "Journal of Lightwave Technology", Vol. LT-5, No. 4, April 1987, N.A. Olsson et al published an article titled "Performance Characteristics of 1.5 um External Cavity Semiconductor Lasers for Coherent Optical Communication". This article describes an external cavity laser system that uses feedback to control the cavity length with a PZT. Also described is an intra-cavity etalon that narrows the passband of the cavity. The angle of the etalon is changed to tune between the internal modes of the laser. As is well known in the art, the etalon will periodically narrow the optical passband width of the grating as the etalon is increasingly tilted in the intracavity beam. The Olsson et al system is shown in FIGS. 6 and 7.

The arrangement of the basic elements of the Olsson et al external cavity laser is best shown in FIG. 6. The light from a laser diode 601 is collimated by a lens 603 and projected through an etalon 605 and retroreflected back to the laser by a grating reflector 607. A PZT element 609 is mechanically coupled to the reflector 607 and is used to adjust the optical path length.

To stabilize the laser, a feedback system is provided as shown in FIG. 7. The feedback system uses a beat detector 701, a mixer 703 to convert the detector output to a lower frequency, a low pass filter 705 to convert the mixer output to a DC (direct current) control level and a high voltage amplifier 707 to amplify the DC control level to the high voltages required to drive the PZT (not shown).

Tuning of the Olsson et al external cavity laser is divided into coarse, medium, and fine tuning. Coarse tuning is performed by rotating the grating reflector 607 and selecting the internal mode which is closest to the desired wavelength. This provides a tuning range of approximately 900 A (Angstroms). The internal modes refer to the longitudinal modes of the laser diode without the external cavity. These modes appear because of the imperfect anti-reflection coating on the laser facet. Medium tuning is the tuning of the laser in between its internal modes, a range of appoximately 19 A. This tuning is achieved by manually adjusting the intra cavity etalon 605 in combination with a fine rotation of the grating reflector 607. Fine tuning is performed by adjustments to the external cavity length that varies the laser frequency within the megahertz range. The PZT 609 is connected to the reflector 607 to facilitate this adjustment.

While the Olsson et al external cavity laser system may eliminate all three types of multimode operations with multiple manual adjustments, there still exists the need for a laser system that eliminates all three types of multimode operations automatically.

SUMMARY OF THE INVENTION

The external cavity laser of the present invention automatically eliminates all three types of multimode operations and can therefore be used to great advantage in optical communications and coherent measurement applications. Furthermore, the present invention achieves the elimination of multimode operations by the adjustment of a single element instead of multiple elements required by prior art devices thereby simplifying the design of the laser system.

The present invention uses a semiconductor laser to generate a beam of coherent light. An etalon is mounted on a galvanometer and is located within the optical path between the semiconductor laser and a retroreflecting grating such that the beam passes through the etalon and is reflected back to the laser semiconductor by the grating.

A feedback circuit is used to control the galvanometer and thereby control the angle of the etalon. The feedback circuit works by converting an output from a multimode (beat frequency) detector into a control current that is used to drive the galvonometer. As the galvanometer moves, the etalon angle, relative to the laser beam, changes until multimode operation is eliminated.

Because only one element of the external cavity laser is adjusted, the design, manufacture and use of the laser system is greatly simplified.

BRIEF DESCRIPTION OF THE DRAWINGS

FIG. 6 is a simplified diagram of a prior art external cavity laser.

FIG. 7 is a simplified diagram of a feedback circuit used in a prior are external cavity laser.

DESCRIPTION OF THE INVENTION

Figure 1:
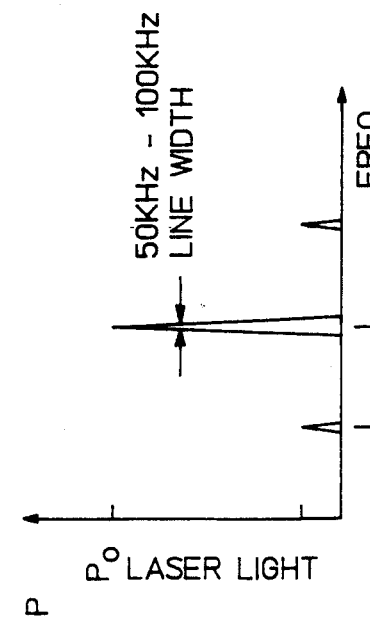
FIG. 1 is a graph of laser light intensity vs laser current.
Figure 3:
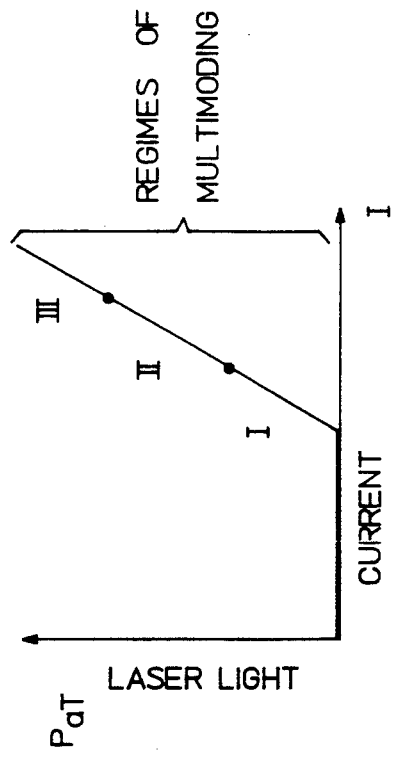
FIG. 3 is a graph showing type II multimode operation.
Figure 2:
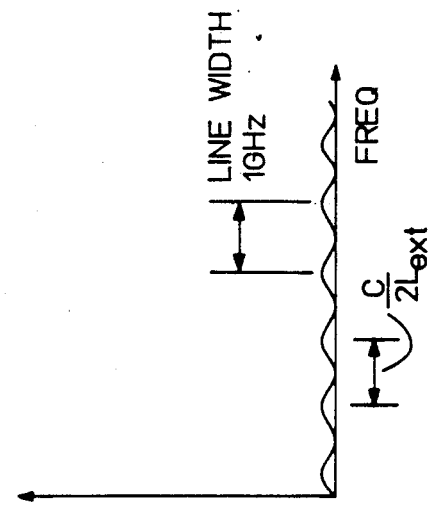
FIG. 2 is a graph showing type I multimode operation.
Figure 4:
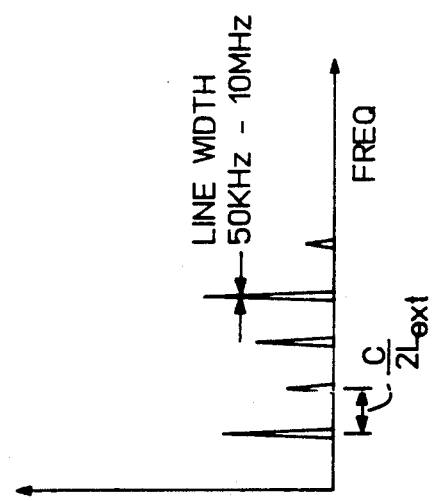
FIG. 4 is a graph showing type III multimode operation.
Figure 5:
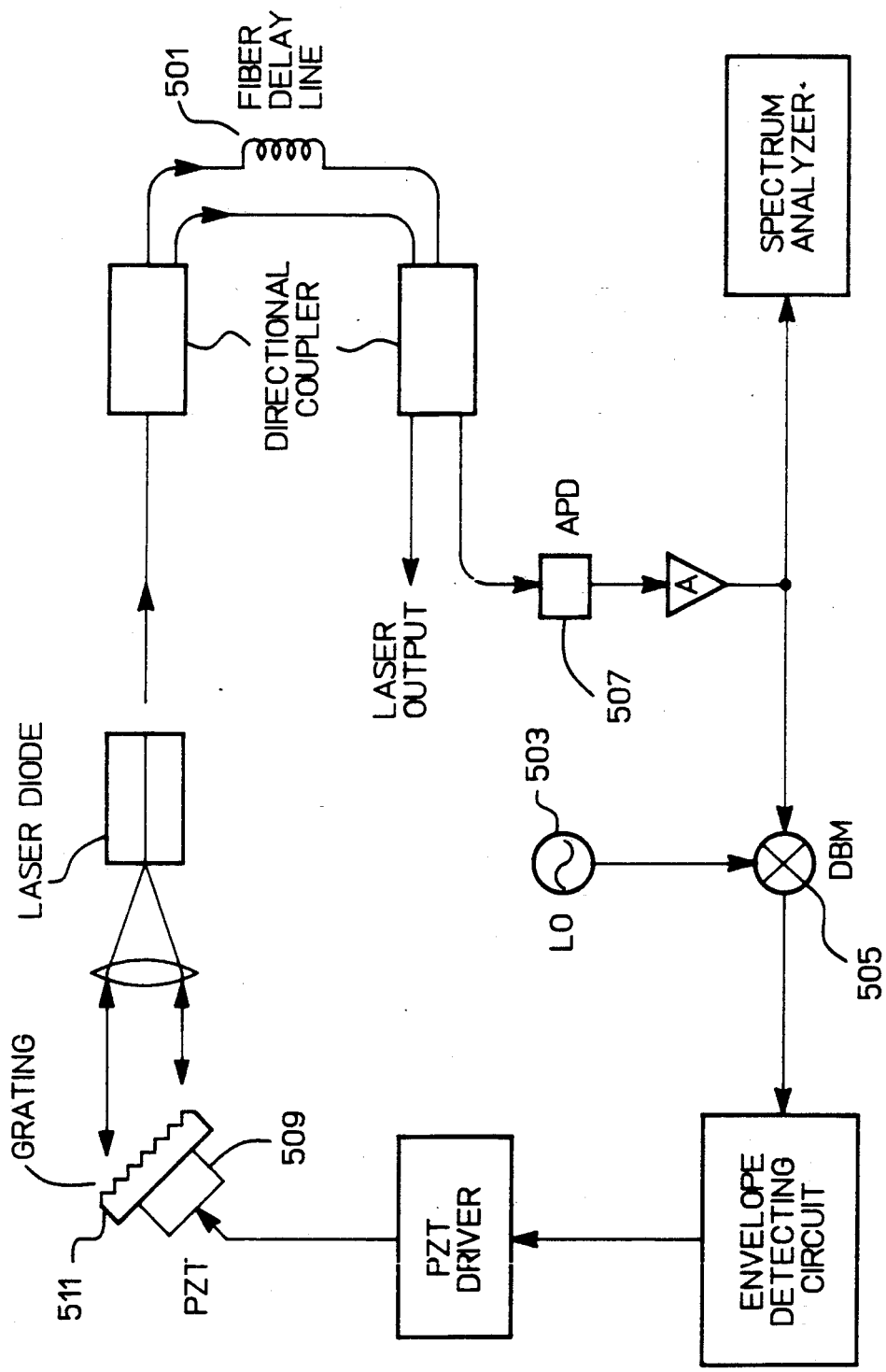
FIG. 5 is a simplified diagram of a prior art external cavity laser.
Figure 8:
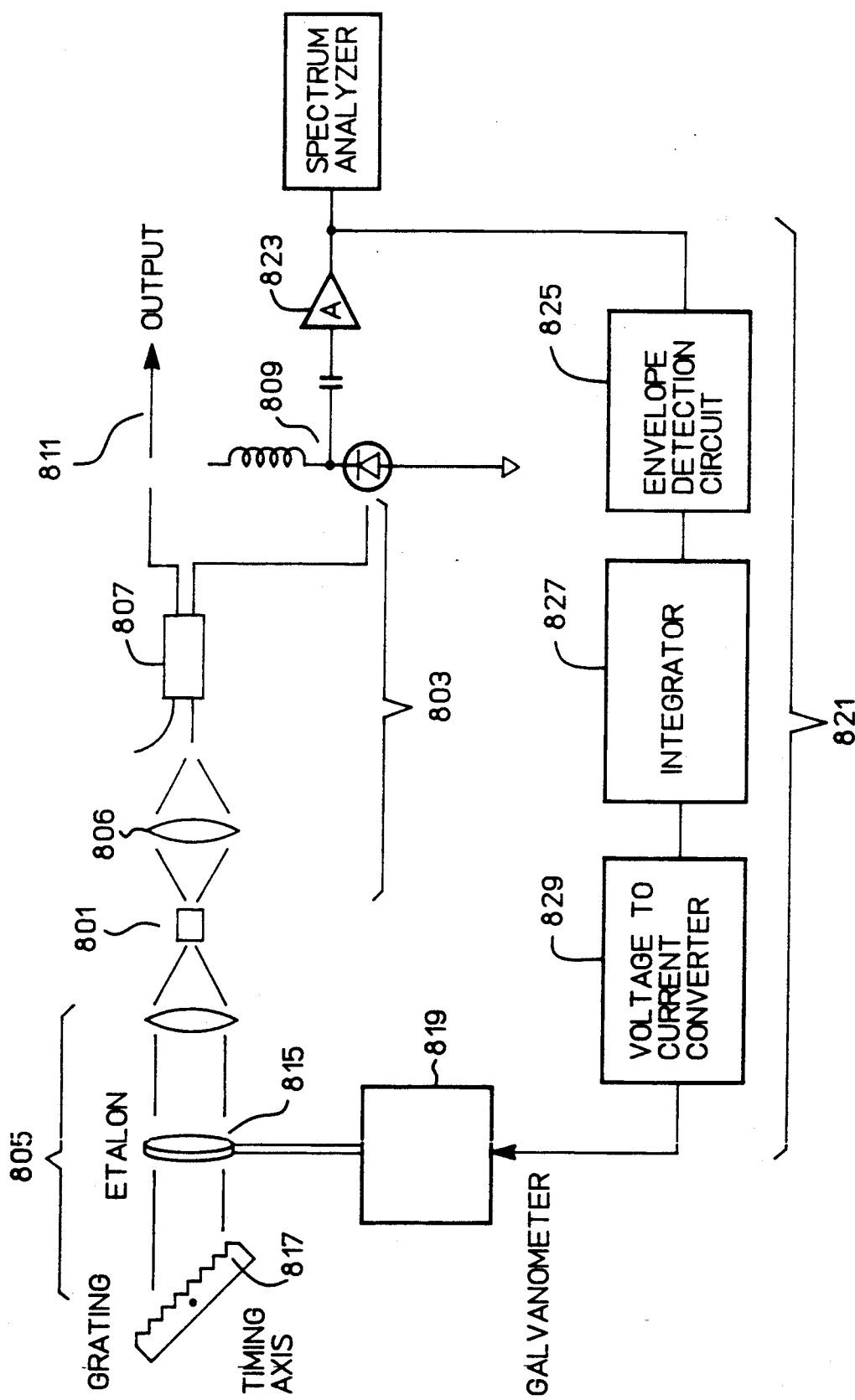
FIG. 8 is a diagram of a preferred embodiment of the present invention.

As is shown in FIG. 8, the present invention is embodied in a tunable external cavity laser. A semiconductor laser 801 generates a first laser beam along a path 803 and a second laser beam along a path 805. The first laser beam is focused by a lens 806 and passes through a fiber optic splitter 807 which splits the beam into two parts. One part is coupled to a beat detector 809 and the other part becomes the laser output 811.

The second laser beam passes through a collimating lens 813 that focuses the beam through an etalon 815 and onto a retroreflector grating 817. A galvanometer 819 is mechanically coupled to, and is able to rotate, the etalon 815. The etalon is approximately 5 mm thick and has a reflective coating of approximately R=4%, per surface, at 1300 nm (nano-meters).

A feedback system 821 is provided to adjust the etalon 815. This feedback system includes the beat detector 809, such as an AT&T avalanche photo diode (APD), connected to an amplifier 823 such as an Avantek AMG 4046M. The output from the amplifier 823 is connected to an envelope detection circuit 825 that is in turn connected to an integrator 827. A voltage to current converter 829, such as an ILX Lightwave LDX-3207, is fed by the integrator 827 and the output from the converter 829 is connected to the galvanometer 819.

If the laser operates in multiple modes, the different frequencies mix and the beat frequency is detected by the beat detector diode 809. The output from the diode 809 is typically a microwave signal that is amplified by the amplifier 823. The envelope detector 825 performs the function of a threshold detector. When the detector 825 receives a signal from the amplifier 823 that exceeds a preset level, the detector 825 outputs a DC voltage to the integrator 827. The output from the detector 825 has two levels, on or off.

The integrator 827 generates an output voltage ramp that is proportional to the time the detector 825 outputs the DC voltage. As the time increases, the output voltage generated by the integrator 827 increases. This output voltage is converted to a current by the voltage to current converter 829. A higher voltage is converted to a higher current.

A General Scanning G120D is used as the galvanometer 819 and the rotation of the galvanometer 819 is controlled by the current from the voltage to current converter 829. As the galvanometer rotates, the etalon 815 rotates.

At some rotation angle of the etalon 815, the pass band of the cavity will be narrowed sufficiently to suppress multimode operation. The beat frequency will disappear, and a signal will no longer be present at the input of the envelope detector 825. Without an input signal, the output from the envelope detector 825 switches to the off state and the output voltage from the integrater 827 is held by the integrator 827 at the current value. With a constant input voltage, the output from the voltage to current converter 829 remains constant thereby maintaining the angle of the etalon 805 constant.

To tune the laser system to a different frequency, the retroreflector grating 817 is rotated to the correct angle, as is well known in the art. Also, the integrator 827 is reset causing the output voltage from the integrator 827 to go to the minimum value that in turn causes the etalon 815 to rotate to a minimum angle. The integrator 827 is released from the reset state and the feedback system 821 now stablilizes the laser system at the new frequency.

Of course, one skilled in the art will be able to modify the feedback circuit without departing from the present invention. For example, the integrator 827, as disclosed, holds the output voltage constant when the beat signal amplitude is reduced. One obvious change would be for the integrator 827 not to hold the output voltage. This change would cause the feedback circuit to continuously adjust the angle of the etalon 815 to reduce multimode operation.

While the etalon has been described as having a reflectivity of approximately 4%, one skilled in the art would be able to adapt an uncoated etalon or an etalon with a higher reflectivity to work in this application.

While a preferred embodiment of the present invention has be described above, it is intended that all matter contained in the above description and shown in the accompanying drawings be interpreted as illustrative and not in a limiting sense and all modifications, constructions and arrangements which fall within the scope of the invention be determined solely from the following claims.

I claim:

1. An etalon stabilized external cavity laser system comprising:
   a laser amplifier means for providing a laser beam;
   a grating means to reflect the laser beam back to the laser amplifier;
   an etalon located between the grating means and the laser amplifier such that the laser beam passes through the etalon;
   a laser beam multimode detector means coupled to the laser beam; and
   an etalon angle adjustment means for adjusting the angle of the etalon relative to the laser beam and responsive to the multimode detector;
   wherein the multimode detector means upon detecting a laser beam multimode operation, causes the etalon angle adjustment means to move the etalon such that the amplitude of all but one mode is reduced.

2. A laser system as in claim 1 wherein:
   the etalon angle adjustment means includes a galvanometer.

3. A laser system as in claim 1 wherein:
   the laser beam multimode detector means includes a semiconductor photodiode.

4. A laser system as in claim 3 wherein:
   the laser beam multimode detector means includes an electronic signal comparator operative to cause the etalon angle adjustment means to adjust the angle of the etalon upon detection of a multimode signal by the semi-conductor diode.

5. An etalon stabilized external cavity laser system comprising:
   a laser amplifier means for providing a laser beam;
   a grating means to reflect the laser beam back to the laser amplifier;
   an etalon located between the grating means and the laser amplifier means such that the laser beam from the laser amplifier to the grating passes through the etalon and the reflected laser beam from the grating to the laser amplifier passes through the etalon;
   a laser beam multimode detector means coupled to the laser beam; the multimode detector having an output signal when a laser beam multimode operation is detected;
   an etalon angle adjustment means for adjusting the angle of the etalon relative to the laser beam; the etalon angle adjustment means having an angle control input; and
   an electronic multimode operation controller operative to receive the output signal from the multimode detector and to provide a control signal to the angle control input thereby causing the etalon angle to change until the laser multimode operation is reduced.

6. A laser system as in claim 5 wherein:
   the etalon angle adjustment means is a galvanometer.

7. A laser system as in claim 5 wherein:
   the multimode detector means includes a semi-conductor diode coupled to a signal level comparator.

8. A laser system as in claim 5 wherein:
   the electronic multimode controller includes a voltage integrator means and a voltage to current converter.

* * * * *